United States Patent
Kim

(10) Patent No.: US 8,009,496 B2
(45) Date of Patent: Aug. 30, 2011

(54) SEMICONDUCTOR DEVICE INCLUDING ASYMMETRIC SENSE AMPLIFIER

(75) Inventor: Hyung-seuk Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 84 days.

(21) Appl. No.: 12/506,352

(22) Filed: Jul. 21, 2009

(65) Prior Publication Data

US 2010/0074041 A1    Mar. 25, 2010

(30) Foreign Application Priority Data

Sep. 25, 2008   (KR) ........................ 10-2008-0094254

(51) Int. Cl.
 *G11C 7/02* (2006.01)
(52) U.S. Cl. .................. 365/207; 365/230.03; 365/203; 365/205
(58) Field of Classification Search .................. 365/207, 365/230.03, 203, 205
See application file for complete search history.

(56) References Cited

U.S. PATENT DOCUMENTS

| 5,949,256 | A | 9/1999 | Zhang et al. | |
| 6,314,028 | B1 * | 11/2001 | Kono | 365/205 |
| 6,477,100 | B2 * | 11/2002 | Takemura et al. | 365/207 |

FOREIGN PATENT DOCUMENTS

| JP | 07085666 A | 3/1995 |
| KR | 1020040000148 A | 1/2004 |

* cited by examiner

*Primary Examiner* — David Lam
(74) *Attorney, Agent, or Firm* — Volentine & Whitt, PLLC

(57) ABSTRACT

A semiconductor device includes an alternating arrangement of memory cell blocks and sense amplifier blocks, such that the sense amplifier blocks include an interior sense amplifier block and a periphery amplifier block. The peripheral amplifier block includes a first sense amplification unit having a first sense amplifier and a second sense amplifier cross-coupled between a bit line and a complementary bit line. The first sense amplifier supplies/receives current to/from the bit line, the second sense amplifier provides/receives current to/from the complementary bit line, and a current driving capability for the first sense amplifier is greater than a current driving capability of the second sense amplifier.

16 Claims, 16 Drawing Sheets

SEMICONDUCTOR DEVICE INCLUDING ASYMMETRIC SENSE AMPLIFIER

CROSS-REFERENCE TO RELATED APPLICATIONS

This application claims the benefit of Korean Patent Application No. 10-2008-0094254 filed on Sep. 25, 2008, the subject matter of which is hereby incorporated by reference.

BACKGROUND

The inventive concept relates to a semiconductor device, and more particularly, to a semiconductor device including a sense amplifier having an asymmetric configuration.

Certain conventional semiconductor devices include a dummy cell block arranged at the margin or periphery of a memory array area. The dummy cell block includes a number of dummy cells that have a similar structure and fabrication as "normal" cells, but are not used during the regular operations of the conventional semiconductor device.

SUMMARY

Embodiments of the inventive concept provide a semiconductor device including an asymmetric sense amplifier.

According to an aspect of the inventive concept, there is provided a semiconductor device comprising; an alternating arrangement of memory cell blocks and sense amplifier blocks, such that the sense amplifier blocks include an interior sense amplifier block and an periphery amplifier block, wherein the peripheral amplifier block comprises a first sense amplification unit comprising a first sense amplifier and a second sense amplifier cross-coupled between a bit line and a complementary bit line, the first sense amplifier supplies/receives current to/from the bit line, the second sense amplifier provides/receives current to/from the complementary bit line, and a current driving capability for the first sense amplifier is greater than a current driving capability of the second sense amplifier.

In a related aspect, a memory cell may be connected to the periphery sense amplifier block via the complementary bit line.

In another related aspect, the first sense amplifier and the second sense amplifier may have different driving capabilities that depend on load differences between the bit line and the complementary bit line.

According to another aspect of the inventive concept, there is provided a semiconductor device comprising; an alternating arrangement of memory cell blocks and sense amplifier blocks, such that the sense amplifier blocks include an interior sense amplifier block and an periphery amplifier block, wherein the periphery sense amplifier block comprises a second sense amplification unit comprising a third sense amplifier and a fourth sense amplifier cross-coupled between a bit line and a complementary bit line, the third sense amplifier supplies/receives current to/from the bit line, the fourth sense amplifier provides/receives current to/from the complementary bit line, and a current driving capability for the fourth sense amplifier is greater than a current driving capability for the third sense amplifier.

In a related aspect, a memory cell may be connected to the periphery sense amplifier block via the bit line.

In another related aspect, the interior sense amplifier block comprises a third sense amplification unit comprising a fifth sense amplifier and a sixth sense amplifier cross-coupled between the bit line and the complementary bit line, the fifth sense amplifier supplies/receives current to/from the bit line, the sixth sense amplifier provides/receives current to/from the complementary bit line, and a driving capability for the fifth sense amplifier is greater than a driving capability for the sixth sense amplifier.

In another related aspect, the first sense amplifier may comprise a first MOS transistor having a gate connected to the complementary bit line and a first terminal connected to the bit line, the second sense amplifier may comprise a second MOS transistor having a gate connected to the bit line and a first terminal connected to the complementary bit line, and the first MOS transistor may have a size larger than that of the second MOS transistor.

In another related aspect, the first MOS transistor and the second MOS transistor may vary in size in relation to a difference between respective loads on the bit line and the complementary bit line. In another related aspect, the first MOS transistor and the second MOS transistor may vary in size in relation to respective numbers of memory cells connected to the bit line and the complementary bit line.

In another related aspect, the first sense amplification unit will supply current to the bit line and the complementary bit line when the bit line and the complementary bit line are precharged to ground voltage. In another related aspect, the first sense amplification unit may receive current from the bit line and the complementary bit line when the bit line and the complementary bit line are precharged to a power supply voltage.

In another related aspect, the semiconductor device may further comprise a precharge unit configured to precharge the bit line and the complementary bit line to either a power supply voltage or ground voltage. In another related aspect, the semiconductor device may further comprise a data restoration unit configured to restore a data value to the memory cell.

BRIEF DESCRIPTION OF THE DRAWINGS

Exemplary embodiments of the inventive concept will be more clearly understood from the following detailed description taken in conjunction with the accompanying drawings in which.

DESCRIPTION OF EMBODIMENTS

Figure 1:
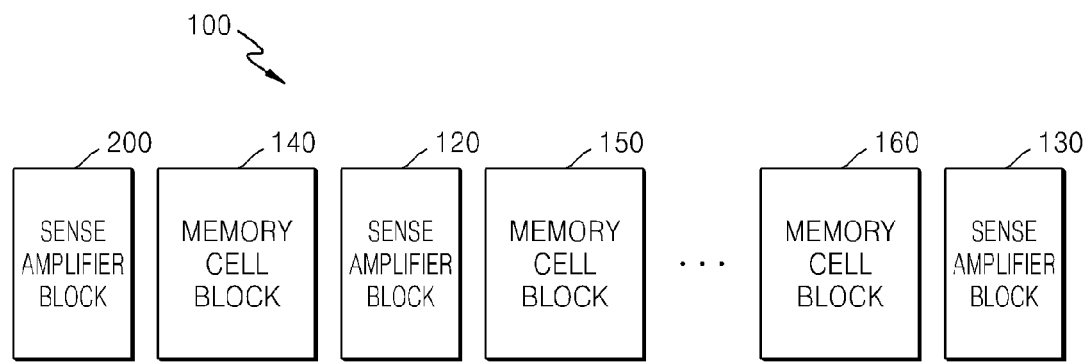
FIG. 1 is a block diagram showing a semiconductor device according to an embodiment of the inventive concept.

The attached drawings for illustrating exemplary embodiments of the inventive concept are referred to in order to gain a sufficient understanding of the inventive concept, the merits thereof, and the objectives accomplished by the implementation of the inventive concept.

Hereinafter, the inventive concept will be described in some additional detail with reference to the attached drawings. Throughout the written description and drawings, like reference numerals are used to denote like or similar elements.

FIG. 1 is a block diagram of a semiconductor device 100 according to an embodiment of the inventive concept. Referring to FIG. 1, the semiconductor device 100 comprises memory cell blocks 140, 150 and 160 and sense amplifier blocks 200, 120 and 130. The memory cell blocks 140, 150 and 160 and corresponding sense amplifier blocks 200, 120 and 130 are alternately arranged. The "periphery" sense amplifier blocks 200 and 130 are located laterally outermost in this arrangement, and therefore may have different structure than the "interior" sense amplifier block 120.

Figure 2:
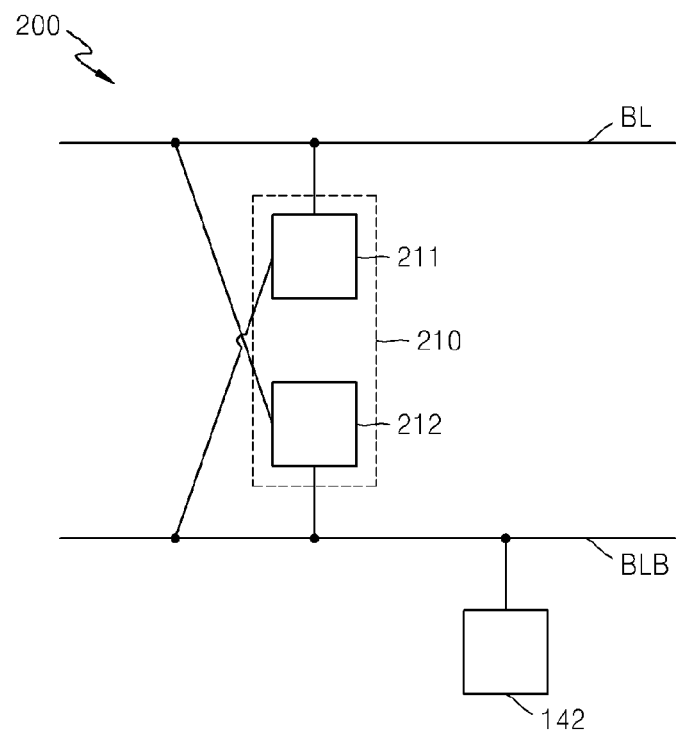
FIG. 2 is a block diagram further illustrating the periphery sense amplifier block of FIG. 1 according to an embodiment of the inventive concept.

FIG. 2 is a block diagram further illustrating the sense amplifier block 200 of FIG. 1. Within FIG. 2, a second memory cell 142 is connected to the sense amplifier block 200 and may be included in the memory cell block 140 of FIG. 1. Because the sense amplifier block 200 is a periphery sense amplifier block, the second memory cell 142 is connected via a complementary bit line BLB and not connected to a bit line BL. Although FIG. 2 illustrates only a single memory cell connected to the complementary bit line BLB, the present invention is not limited thereto and any reasonable number of memory cells might be connected to the complementary bit line BLB.

In the embodiment illustrated in FIG. 2, the sense amplifier block 200 include a first sense amplification unit 210 configured to sense a difference between voltages apparent on the bit line BL and the complementary bit line BLB. Thus, the first sense amplification unit 210 supplies/receives a predetermined current to/from the bit line BL and the complementary bit line BLB to amplify the voltage difference between the bit line BL and the complementary bit line BLB.

In the illustrated example, the first sense amplification unit 210 includes a first sense amplifier 211 and a second sense amplifier 212 that are cross-coupled to the bit line BL and the complementary bit line BLB. The first sense amplifier 211 supplies/receives current to/from the bit line BL. The second sense amplifier 212 supplies/receives current to/from the complementary bit line BLB. In one more specific embodiment of the inventive concept, the current driving capability of the first sense amplifier 211 is greater than that of the second sense amplifier 212.

Figure 3:
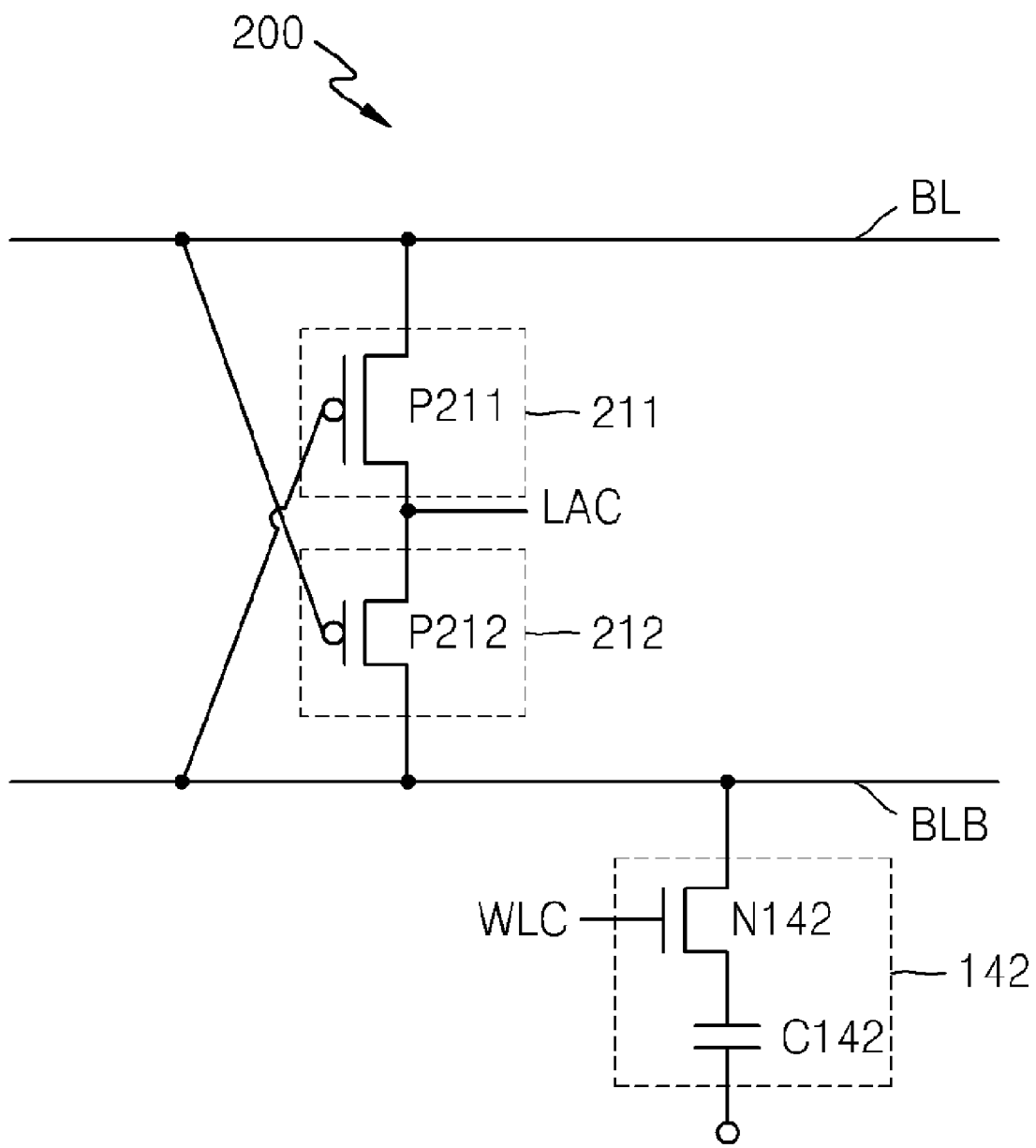
FIG. 3 is a circuit diagram further illustrating the sense amplifier block of FIG. 2.

FIG. 3 is a circuit diagram further illustrating the sense amplifier block 200 of FIG. 2, including the second memory cell 142 connected to the sense amplifier block 200. FIG. 3 further illustrates the second memory cell 142 as comprising a second transistor N142 and a second capacitor C142. However, other embodiments of the second memory cell 142 are possible including those having more than one transistor and/or capacitor.

Referring to FIG. 3, the first sense amplifier 211 and the second sense amplifier 212 respectively include a first PMOS transistor P211 and a second PMOS transistor P212. The first PMOS transistor P211 has a size larger than that of the second PMOS transistor P212.

Figure 4:
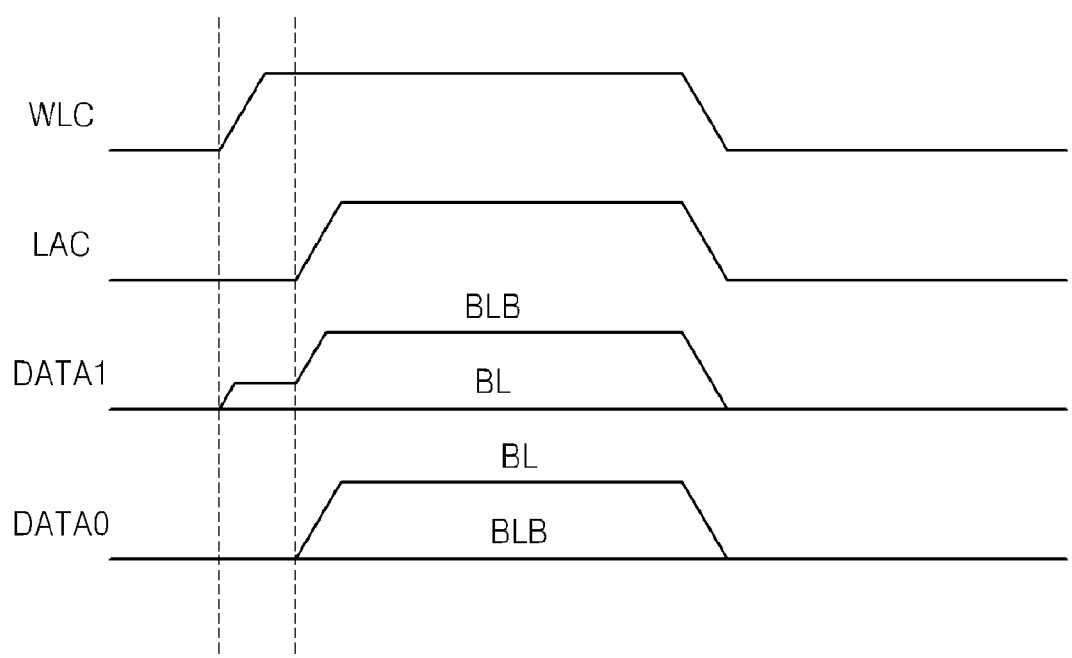
FIG. 4 is a timing diagram illustrating an operation of selecting the second memory cell illustrated in FIG. 3.

FIG. 4 is a timing diagram illustrating an operation of selecting the second memory cell of FIG. 3. In this working example, it is assumed that the bit line BL and the complementary bit line BLB are precharged to a ground voltage.

Referring to FIG. 4, the second memory cell 142 is selected when a second memory cell control signal WLC transitions from a low logic level to a high logic level (i.e., "goes high"). If the data stored by the second memory cell 142 has a value of '1', that is, if the second capacitor C142 is charged, said charge is charge-shared with the complementary bit line BLB. As a result, the voltage apparent on the complementary bit line BLB increases above that of the voltage apparent on the bit line BL. Accordingly, the voltage applied to the gate of the second PMOS transistor P212 falls below the voltage applied to the gate of the first PMOS transistor P211. When a first control signal LAC also goes high, the second PMOS transistor P212 supplies current to the complementary bit line BLB to increase the voltage on the complementary bit line BLB since the driving capability of the second PMOS transistor P212 is greater than that of the first PMOS transistor P211.

However, if the data stored on the second memory cell 142 has a value of '0', that is, if the second capacitor C142 is not charged, the voltage on the complementary bit line BLB is maintained equal with that of the voltage on the bit line BL. Thus, the voltage applied to the gate of the second PMOS transistor P212 will equal the voltage applied to the gate of the first PMOS transistor P211. When the first control signal LAC then goes high, the driving capability of the first PMOS transistor P211 becomes greater than that of the second PMOS transistor P212, since the first PMOS transistor P211 has a size larger than that of the second PMOS transistor P212. Accordingly, the first PMOS transistor P211 supplies current to the bit line BL and increases the voltage on the bit line BL.

In the exemplary configuration of FIG. 3, the second memory cell 142 is connected to only one side of the periphery sense amplifier block 200, and thus a bit line mismatch may occur. However, the periphery sense amplifier block 200 of the semiconductor device 100 according to the present embodiment of the inventive concept can compensate for any bit line mismatch because the sense amplifier block 200 has an asymmetric configuration.

The sense amplifier block 200 may be designed such that a size difference between the first PMOS transistor P211 and the second PMOS transistor P212 depends on a difference between the loads applied to the bit line BL and the complementary bit line BLB. For example, the sense amplifier block 200 may be designed such that the size difference between the first PMOS transistor P211 and the second PMOS transistor P212 is small when the load on the complementary bit line BLB is larger than the load on the bit line BL. Furthermore, the sense amplifier block 200 may be designed such that the size of the second PMOS transistor P212 is much greater than the size of the first PMOS transistor P211 when the load on the complementary bit line BLB is considerably large. Alternately, the first and second PMOS transistors P211 and P212 may have the same size, as dictated by the relevant circumstances.

Although FIG. 4 shows only a single second memory cell 142 connected to the complementary bit line BLB, the present invention is not limited thereto and any reasonable number of memory cells may be connected to the complementary bit line BLB. The resulting load placed on the complementary bit line BLB increases with the number of memory cells connected to the complementary bit line BLB. Accordingly, the sense amplifier block 200 may be designed such that the size difference between the first PMOS transistor P211 and the second PMOS transistor P212 decreases when the number of memory cells connected to the complementary bit line BLB increases. If the number of memory cells connected to the complementary bit line BLB further increases, the sense amplifier block 200 may be designed such that the size of the second PMOS transistor P212 is greater than the size of the first PMOS transistor P211.

Figure 5:
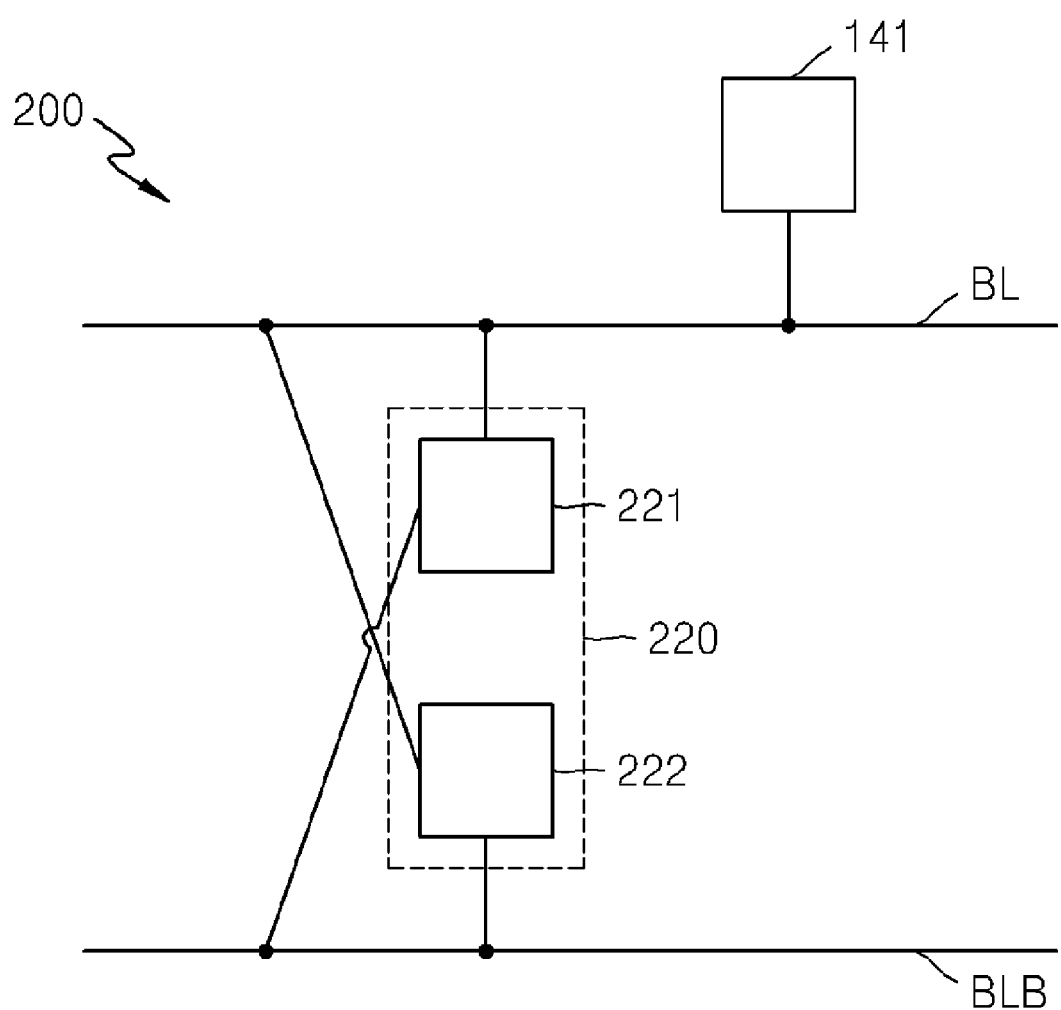
FIG. 5 is a block diagram further illustrating the sense amplifier block of FIG. 1 according to another embodiment of the inventive concept.

FIG. 5 is a block diagram illustrating the sense amplifier block 200 of FIG. 1 according to another embodiment of the inventive concept. In the configuration of FIG. 2, the second memory cell 142 is connected to the complementary bit line BLB and no memory cell is connected to the bit line BL. However, in the configuration of FIG. 5, a first memory cell 141 is connected to the bit line BL and no memory cell is connected to the complementary bit line BLB.

Referring to FIG. 5, the sense amplifier block 200 includes a second sense amplification unit 220 that senses the voltage difference between the bit line BL and the complementary bit line BLB and supplies/receives a predetermined current to/from the bit line BL and the complementary bit line BLB to amplify the voltage difference between the bit line BL and the complementary bit line BLB.

In the illustrated embodiment, the second sense amplification unit 220 includes a third sense amplifier 221 and a fourth sense amplifier 222 that are cross-coupled to the bit line BL and the complementary bit line BLB.

The third sense amplifier 221 supplies/receives current to/from the bit line BL. The fourth sense amplifier 222 supplies/receives current to/from the complementary bit line BLB. In one more specific embodiment, the current driving capability of the third sense amplifier 221 is greater than that of the fourth sense amplifier 222.

Figure 6:
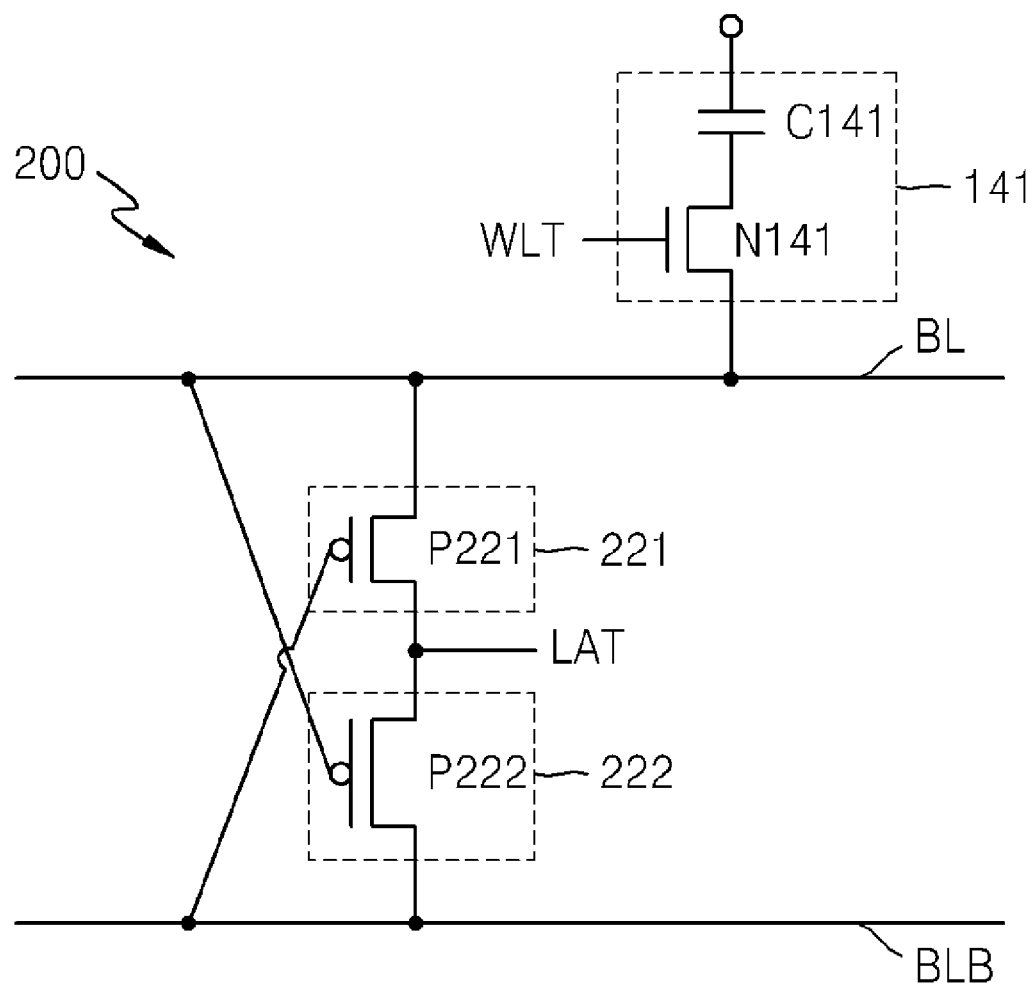
FIG. 6 is a circuit diagram further illustrating the sense amplifier block of FIG. 5 according to an embodiment of the inventive concept.

FIG. 6 is a circuit diagram further illustrating the sense amplifier block of FIG. 2 according to an embodiment of the inventive concept. Referring to FIG. 6, the third sense amplifier 221 and the fourth sense amplifier 222 respectively include a third PMOS transistor P221 and a fourth PMOS transistor P222 that has a size greater than that of the third PMOS transistor P221.

Figure 7:
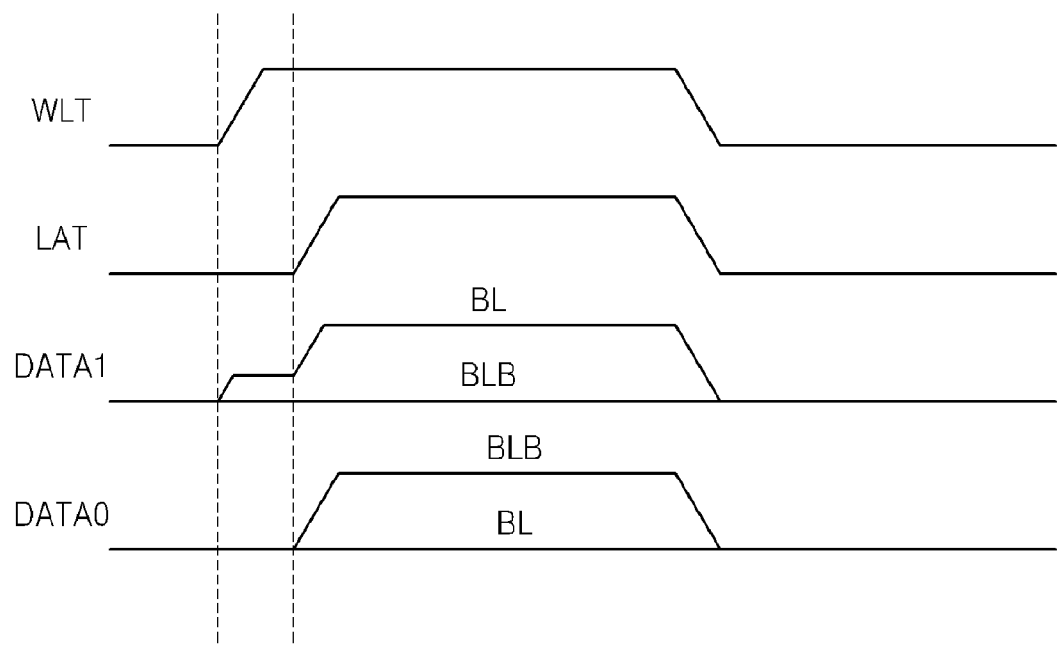
FIG. 7 is a timing diagram illustrating an operation of selecting a first memory cell of FIG. 6.

FIG. 7 is a timing diagram illustrating an operation of selecting the first memory cell of FIG. 6. In this working example, it is assumed that the bit line BL and the complementary bit line BLB are precharged to a ground voltage.

Referring to FIG. 7, the first memory cell 141 is selected when a first memory cell control signal WLT goes high. If the data stored in the first memory cell 141 has a value of '1', that is, if a first capacitor C141 included in the first memory cell 141 is charged, said charge is charge-shared with the bit line BL. Thus, the voltage on the bit line BL increases above the voltage apparent on the complementary bit line BLB. Accordingly, the voltage applied to the gate of the third PMOS transistor P221 falls below the voltage applied to the gate of the fourth PMOS transistor P222. When a second control signal LAT also goes high, the driving capability of the third PMOS transistor P221 becomes greater than that of the fourth PMOS transistor P222. Accordingly, the third PMOS transistor P221 supplies current to the bit line BL to increase the voltage of the bit line BLB.

However, if the data stored in the first memory cell 141 has a value of '0', that is, if the first capacitor C141 is not charged, the voltage of the bit line BLB is maintained equal with that of the voltage apparent on the complementary bit line BLB. As a result, the voltage applied to the gate of the third PMOS transistor P221 equals the voltage applied to the gate of the fourth PMOS transistor P222. When the second control signal LAT goes high, the driving capability of the fourth PMOS transistor P222 becomes greater than that of the third PMOS transistor P221, since the fourth PMOS transistor P222 has a size larger than that of the third PMOS transistor P221. Accordingly, the fourth PMOS transistor P222 supplies a current to the complementary bit line BLB to increase the voltage on the complementary bit line BLB.

In the configuration of FIG. 6, the sense amplifier block 200 may be designed such that a size difference between the third PMOS transistor P221 and the fourth PMOS transistor P222 depends on the difference between loads on the bit line BL and the complementary bit line BLB, as has been described above with reference to FIG. 3.

Figure 8:
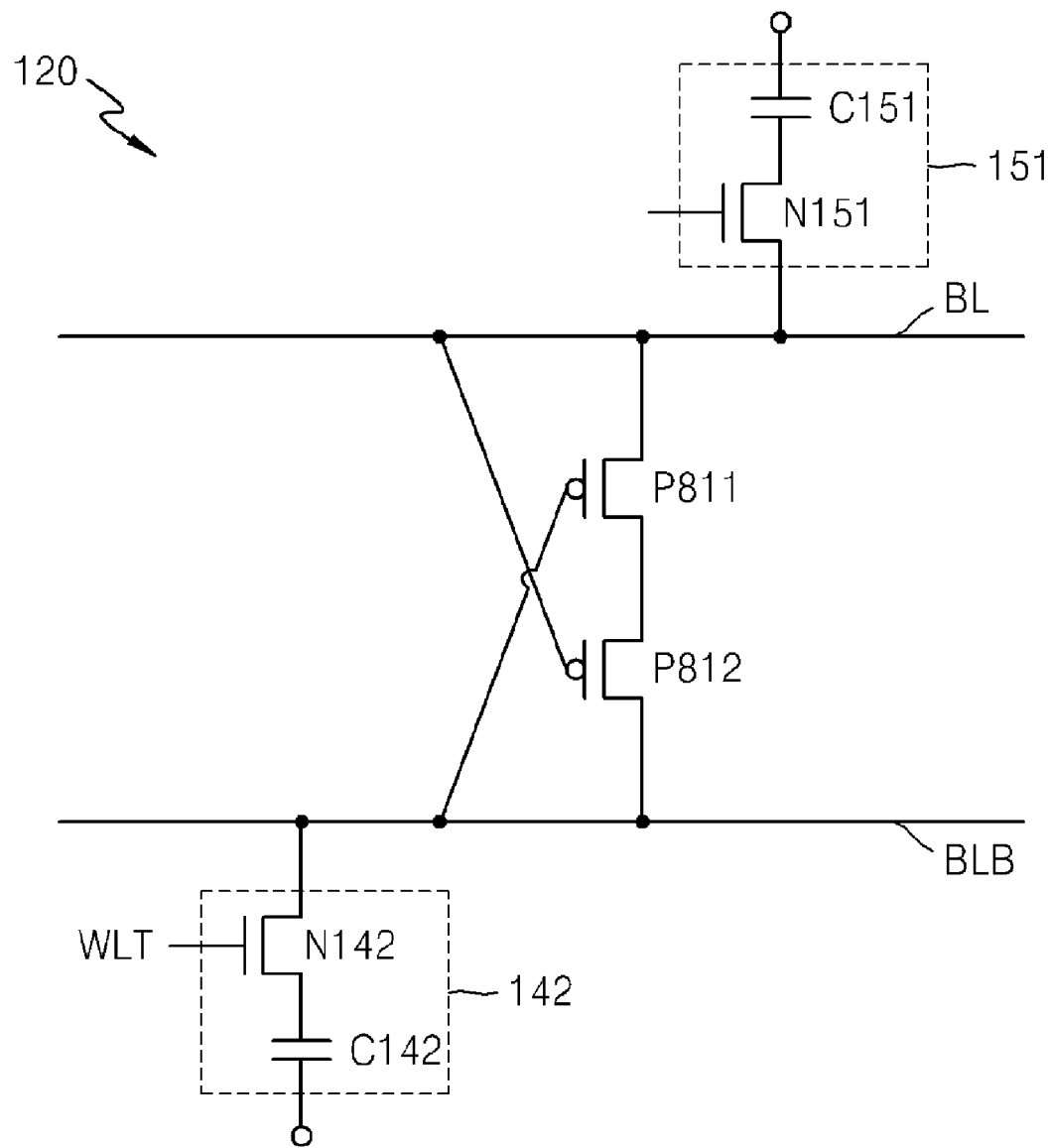
FIG. 8 is a circuit diagram further illustrating an interior sense amplifier block of FIG. 1 according to an embodiment of the inventive concept.

FIG. 8 is a block diagram further illustrating the interior sense amplifier block 120 of FIG. 1. Referring to FIG. 1, the memory cell blocks 140 and 150 are respectively connected at opposite sides of the interior sense amplifier block 120. In FIG. 8, a memory cell 151 is connected to one side of the sense amplifier block 120 and the second memory cell 142 is connected to the other side of the sense amplifier block 120.

Referring collectively to FIGS. 3 and 6, the periphery sense amplifier block 200 includes transistors having different sizes. However, the interior sense amplifier block 120 may include PMOS transistors P811 and P812 having the same size. Accordingly, in the semiconductor device 100 according to an embodiment of the inventive concept, the interior sense amplifier block 120 is said to have a symmetric configuration while the periphery sense amplifier block 200 is said to have an asymmetric configuration. That is, the transistors included in the interior sense amplifier block 120 have the same size while the transistors included in the periphery sense amplifier block 200 have different sizes.

The memory cell block 140 is connected at only one side of the periphery sense amplifier block 200, and thus a bit line mismatch may occur. However, the sense amplifier block 200 of the semiconductor device according to an embodiment of the inventive concept can compensate for any bit line mismatch because the sense amplifier block 200 has an asymmetric configuration.

Figure 9:
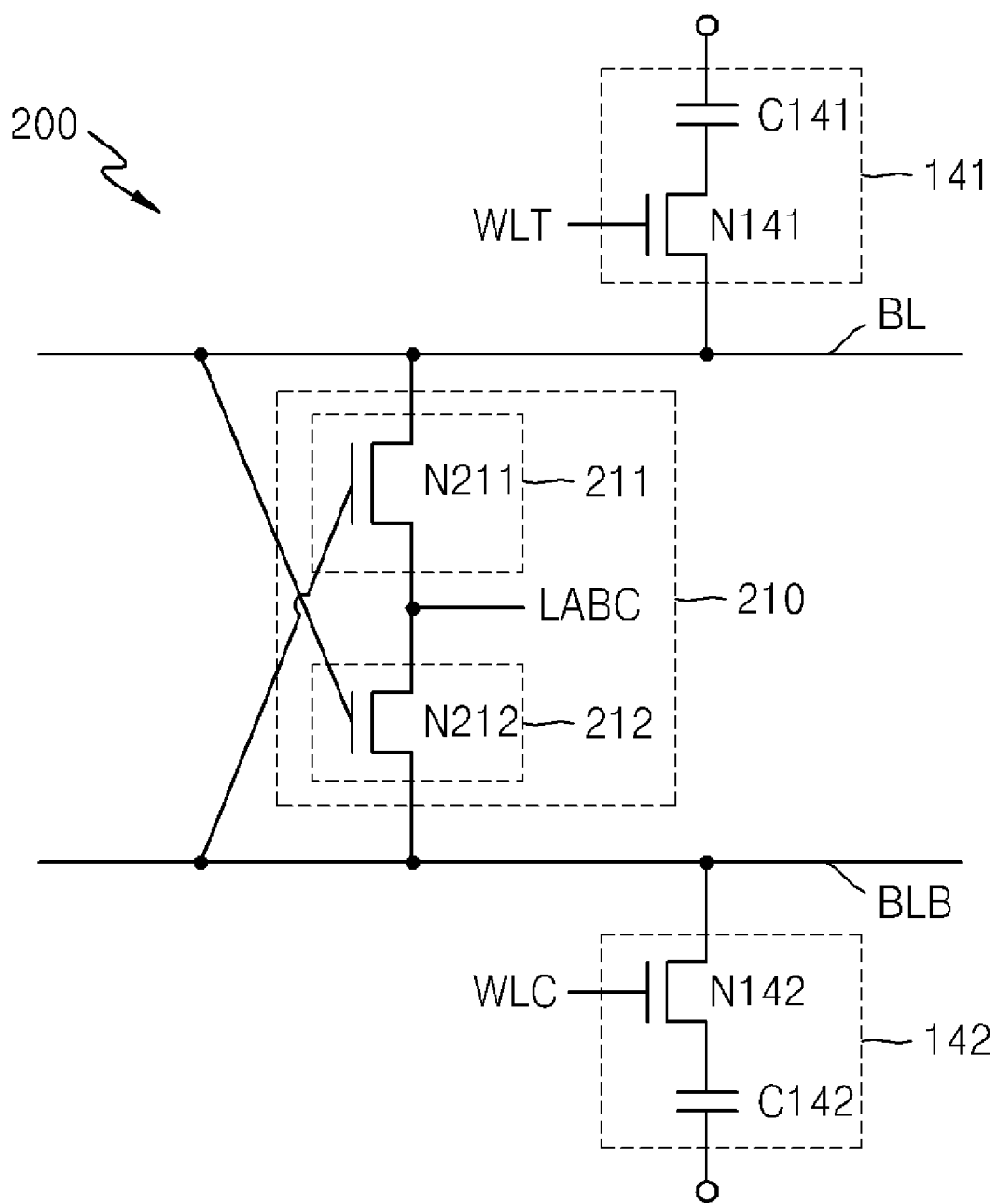
FIG. 9 is a circuit diagram further illustrating the sense amplifier block of FIG. 2, according to another embodiment of the inventive concept.

FIG. 9 is a circuit diagram further illustrating the periphery sense amplifier block 200 of FIG. 2 according to another embodiment of the inventive concept. Referring to FIG. 9, the first sense amplifier 211 and the second sense amplifier 212 can respectively include a first NMOS transistor N211 and a second NMOS transistor N212. The first NMOS transistor N211 has a size greater than that of the second NMOS transistor N212.

Figure 10:
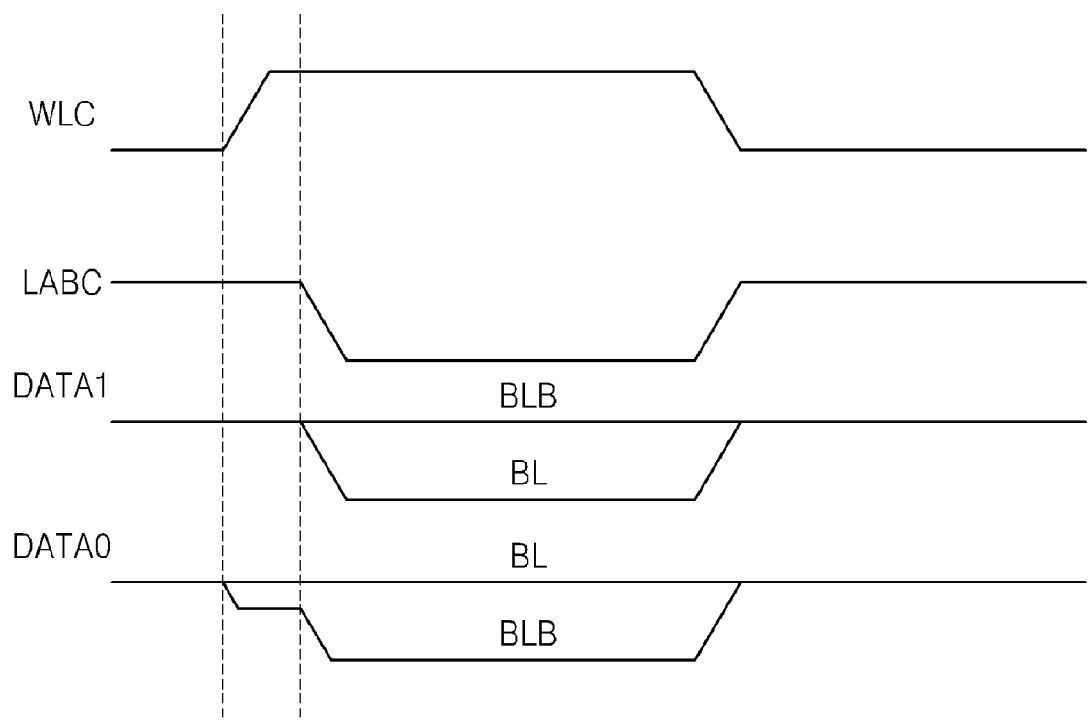
FIG. 10 is a timing diagram illustrating an operation of selecting the second memory cell of FIG. 9.

FIG. 10 is a timing diagram illustrating an operation of selecting the second memory cell 142 of FIG. 9. In this working example, it is assumed that the bit line BL and the complementary bit line BLB are precharged to a power supply voltage.

When the second memory cell control signal WLC goes high, the second memory cell 142 is selected. If the data stored in the second memory cell 142 has a value of '1', that is, if the second capacitor C142 is charged, the voltage on the complementary bit line BLB is maintained equal to the voltage of the bit line BL. That is, a precharged logic high state is maintained. In this case, the voltage applied to the gate of the first NMOS transistor N211 equals the voltage applied to the gate of the second NMOS transistor N212. When a fourth control signal LABC then goes low, the driving capability of the first NMOS transistor N211 becomes greater than that of the second NMOS transistor N212 because the first NMOS transistor N211 has a size larger than that of the second NMOS transistor N212. Accordingly, the first NMOS transistor N211 receives current from the bit line BLB to decrease the voltage on the bit line BL.

However, if the data stored in the second memory cell 142 is '0', that is, if the second capacitor C142 is not charged, charge-sharing occurs between the complementary bit line BLB and the second capacitor C142. Accordingly, the voltage of the complementary bit line BLB falls below the voltage of the bit line BL. In this case, the voltage applied to the gate of the second NMOS transistor N212 is higher than the voltage applied to the first NMOS transistor N211. When the fourth control signal LABC goes low, the second NMOS transistor N212 receives current from the complementary bit line BLB to decrease the voltage of the complementary bit line BLB since the driving capability of the second NMOS transistor N212 becomes greater than that of the first NMOS transistor N211.

Figure 11:
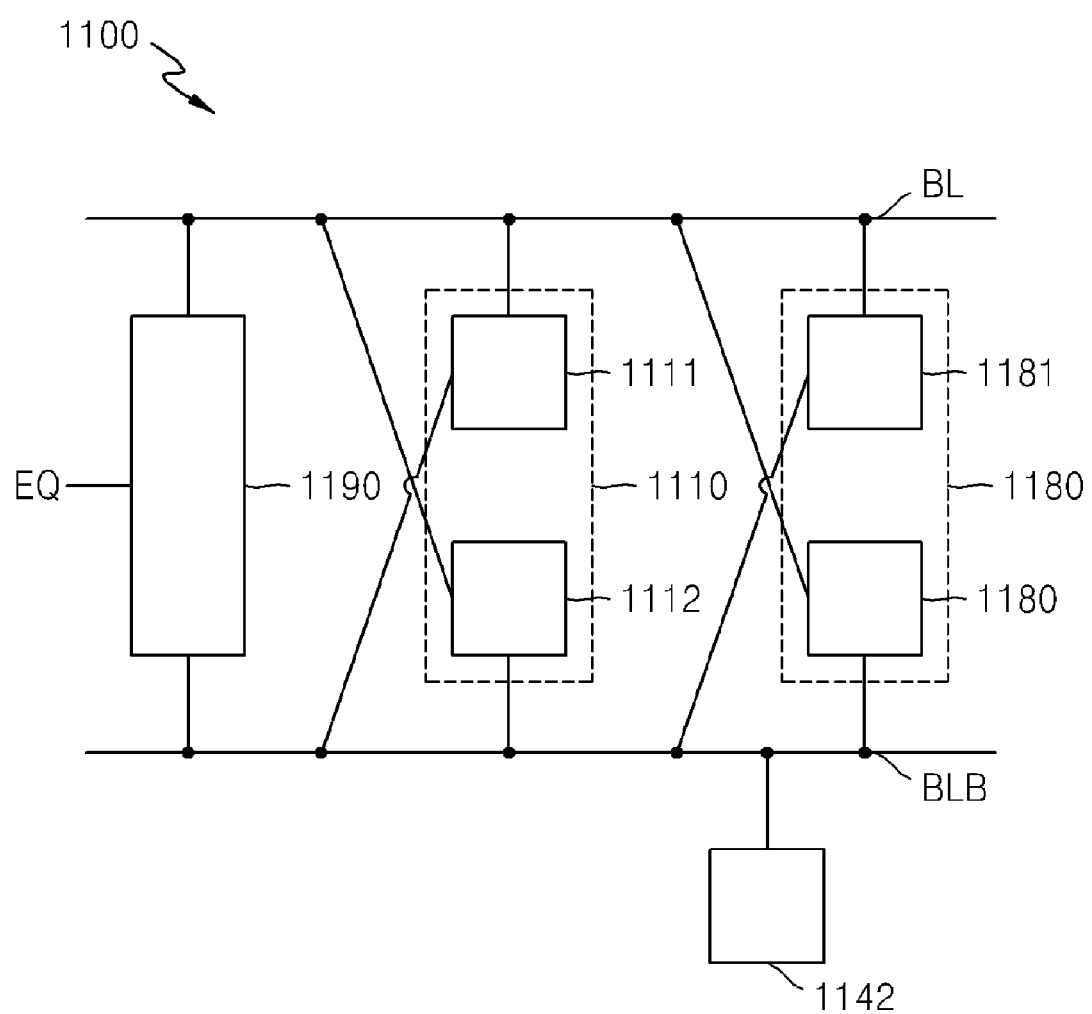
FIG. 11 is a block diagram of a semiconductor device according to another embodiment of the inventive concept.

FIG. 11 is a block diagram of a semiconductor device 1100 according to another embodiment of the inventive concept. The semiconductor device 1100 illustrated in FIG. 11 further comprises a precharge unit 1190 and a data restoration unit 1180, as distinguished from the semiconductor device 100 illustrated in FIG. 2. The precharge unit 1190 may precharge the bit line BL and the complementary bit line BLB to the power supply voltage or ground voltage. The data restoration unit 1180 may be used to restore a data value of '0'.

Figure 12:
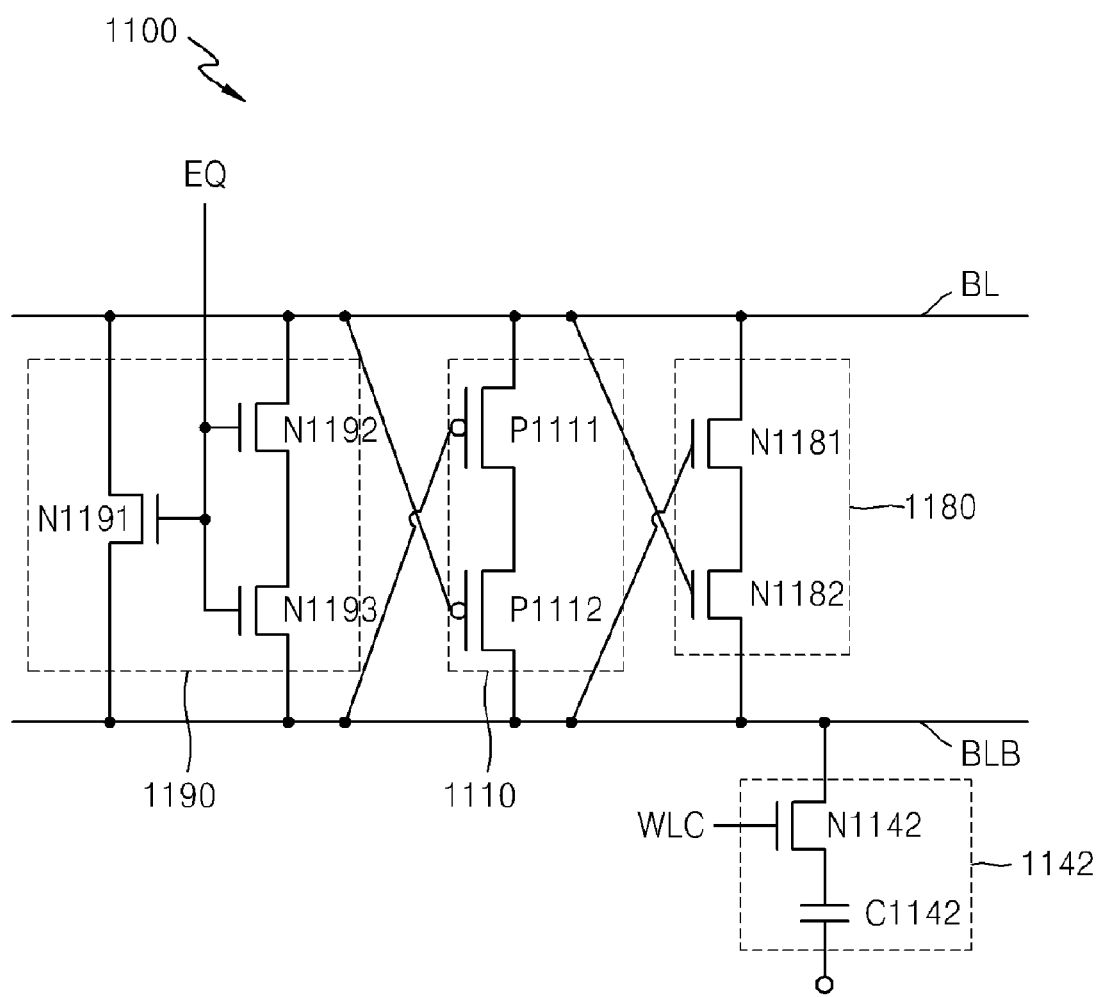
FIG. 12 is a circuit diagram further illustrating the semiconductor device of FIG. 11.

FIG. 12 is a circuit diagram further illustrating the semiconductor device 1100 of FIG. 11. Referring to FIG. 12, the precharge unit 1190 includes a first precharge NMOS transistor N1191, a second precharge NMOS transistor N1192 and a third precharge NMOS transistor N1193.

The first precharge NMOS transistor N1191, the second precharge NMOS transistor N1192 and the third precharge NMOS transistor N1193 precharge the bit line BL and the complementary bit line BLB to the voltage of a precharge control signal EQ in response to the precharge control signal EQ. For example, the first precharge NMOS transistor N1191, the second precharge NMOS transistor N1192 and the third precharge NMOS transistor N1193 can precharge the bit line BL and the complementary bit line BLB to the power supply voltage or ground voltage.

The data restoration unit 1180 can include two NMOS transistors N1181 and N1182 that are cross-coupled to the bit line BL and the complementary bit line BLB.

Figure 13:
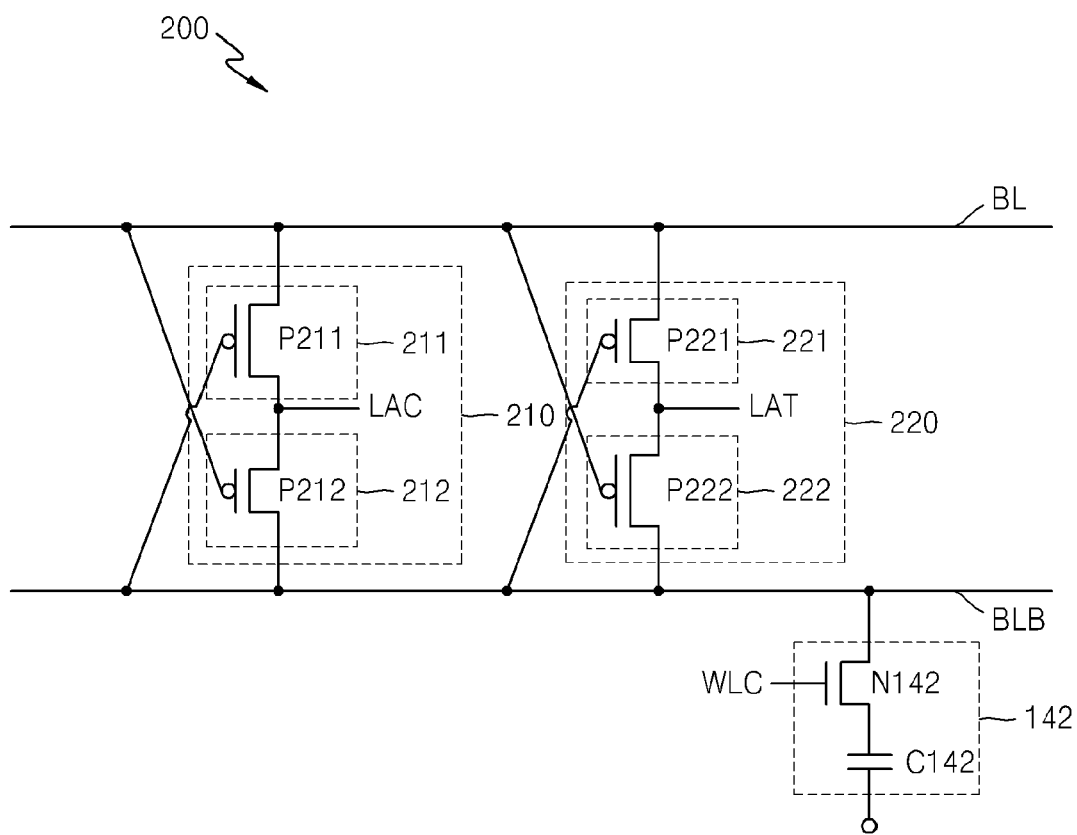
FIG. 13 is a circuit diagram further illustrating the sense amplifier block of FIG. 6 according to another embodiment of the inventive concept.

FIG. 13 is a circuit diagram further illustrating the sense amplifier block 200 of FIG. 6 according to another embodiment of the inventive concept.

The sense amplifier block 200 of FIG. 2 includes the first sense amplification unit 210, and the sense amplifier block 200 of FIG. 5 includes the second sense amplification unit 220. The sense amplifier block 200 of FIG. 13 includes both the first and second sense amplification units 210 and 220. The first sense amplification unit 210 and the second sense amplification unit 220 perform their respective amplification operations with respect to one another, as will be explained later.

Referring to FIG. 13, the first sense amplification unit 210 includes the first sense amplifier 211 and the second sense amplifier 212, and the second amplification unit 220 includes the third sense amplifier 221 and the fourth sense amplifier 222. The first sense amplifier 211 and the second sense amplifier 212 are cross-coupled to the bit line BL and the complementary bit line BLB, and the third sense amplifier 221 and the fourth sense amplifier 222 are also cross-coupled to the bit line BL and the complementary bit line BLB.

The first sense amplifier 211, the second sense amplifier 212, the third sense amplifier 221 and the fourth sense amplifier 222 can respectively include the first PMOS transistor P211, the second PMOS transistor P212, the third PMOS transistor P221 and the fourth PMOS transistor P222. The first PMOS transistor P211 has a size greater than that of the second PMOS transistor P212 and the fourth PMOS transistor P222 has a size greater than that of the third PMOS transistor P221.

Figure 14:
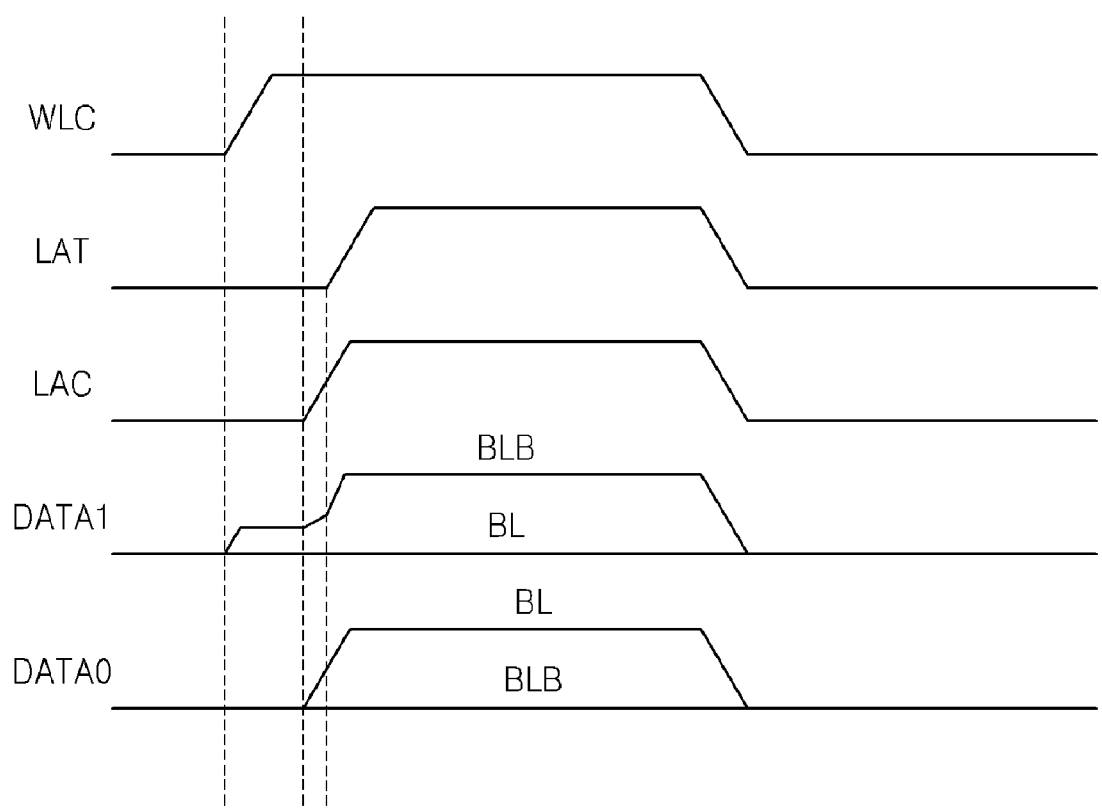
FIG. 14 is a timing diagram illustrating an operation of selecting the second memory cell of FIG. 13.

FIG. 14 is a timing diagram illustrating an operation of selecting the second memory cell 142 of FIG. 13. In the working example, it is assumed that the bit line BL and the complementary bit line BLB are precharged to ground voltage.

The second memory cell 142 is selected when the second memory cell control signal WLC is goes high. If the data stored in the second memory cell 142 has a value of '1', that is, if the second capacitor C142 is charged, said charge is charged-shared with the complementary bit line BLB. Accordingly, the voltage on the complementary bit line becomes higher than the voltage on the bit line BL, and thus the voltage applied to the gate of the second PMOS transistor P212 falls below the voltage applied to the gate of the first PMOS transistor P211. When the first control signal LAC goes high and the second control signal LAT is maintained low, the second PMOS transistor P212 provides current to the complementary bit line BLB to increase the voltage of the complementary bit line BLB since the driving capability of the second PMOS transistor P212 is greater than that of the first PMOS transistor P211.

The role of the second sense amplification unit 220 within the amplification operation by the first sense amplification unit 210 will now be explained.

The second PMOS transistor P212 cannot rapidly increase the voltage on the complementary bit line BLB because the size of the second PMOS transistor P212 is smaller than the size of the first PMOS transistor P211. Accordingly, the voltage of the complementary bit line BLB is rapidly increased using the fourth PMOS transistor P222 of the second sense amplification unit 220.

Referring to FIG. 14, the first control signal LAC goes high, and then the second control signal LAT goes high. Accordingly, the third PMOS transistor P221 and the fourth PMOS transistor P222 are able to provide current. At the moment in time when the second control signal LAT goes high, the voltage on the complementary bit line BLB is at an increased level according to the second PMOS transistor P212. Accordingly, the voltage applied to the gate of the fourth PMOS transistor P222 is lower than the voltage applied to the gate of the third PMOS transistor P221, and thus the fourth PMOS transistor P222 provides current to the complementary bit line BLB to increase the voltage on the complementary bit line BL. The voltage of the complementary bit line BLB can, therefore, be rapidly increased because the fourth PMOS transistor P222 has a large size.

If the data stored in the second memory cell 142 has a value of '0', that is, if the second capacitor C142 is not charged, the voltage of the complementary bit line BLB is maintained equal to the voltage of the bit line BL. In this case, the voltage applied to the gate of the second PMOS transistor P212 equals the voltage applied to the gate of the first PMOS transistor P211. When the first control signal LAC goes high and the second control signal LAT is maintained low, the driving capability of the first PMOS transistor P211 becomes greater than that of the second PMOS transistor P212 because the first PMOS transistor P211 has a size larger than that of the second PMOS transistor P212. Accordingly, the first PMOS transistor P211 supplies current to the bit line BL to increase the voltage on the bit line BL.

Here, the voltage of the bit line BL can be rapidly increased using only the first PMOS transistor P211 because the first PMOS transistor P211 has a size larger than that of the second PMOS transistor P212.

From the foregoing, those skilled in the art will be able to understand an example wherein the data stored in the second memory cell 142 has a value of '1'. Accordingly, this particular case will not be recited in detail.

Figure 15:
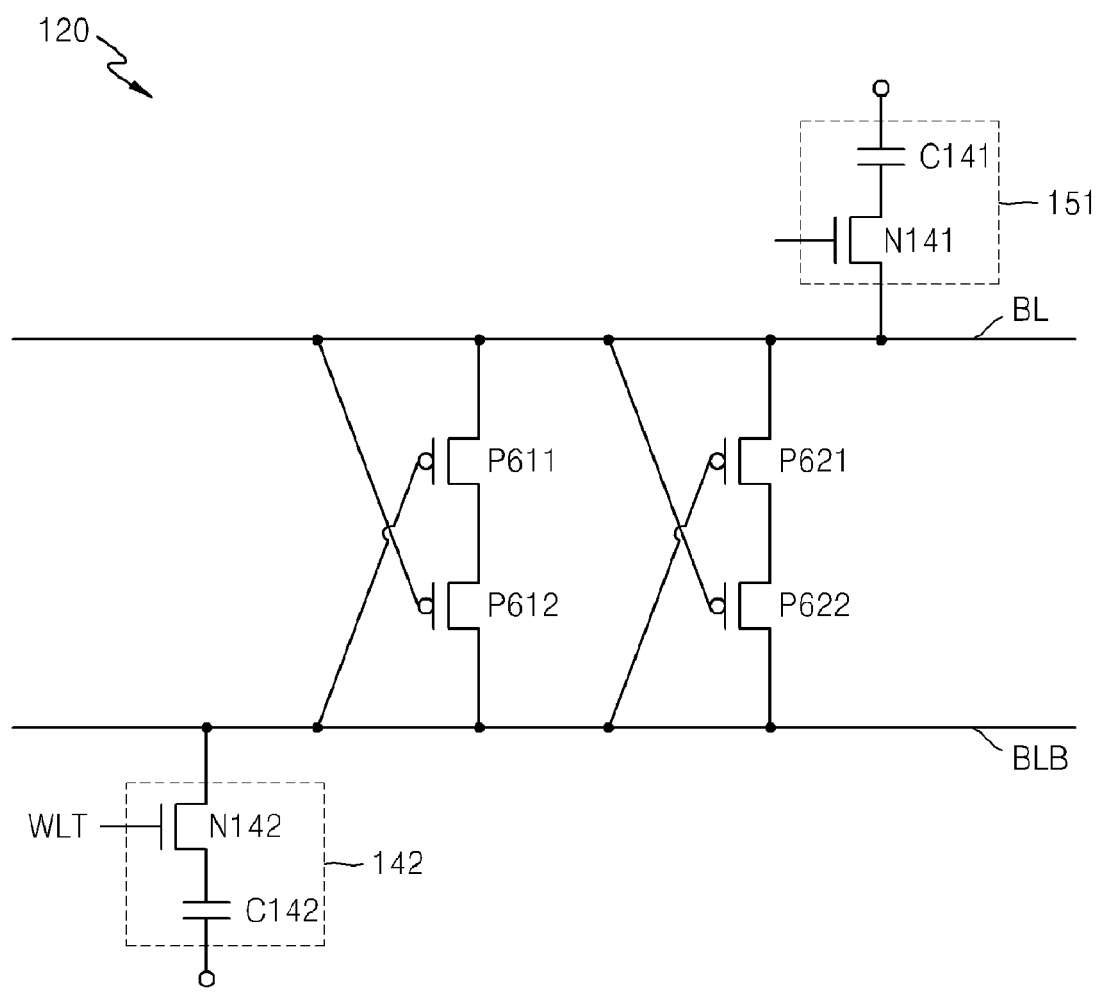
FIG. 15 is a circuit diagram further illustrating the interior sense amplifier block of FIG. 1 according to another embodiment of the inventive concept.

FIG. 15 is a circuit diagram further illustrating the interior sense amplifier block 120 of FIG. 1 according to another embodiment of the inventive concept.

The sense amplifier block 120 illustrated in FIG. 15 further comprises two PMOS transistors P621 and P622, as distinguished from the sense amplifier block 120 illustrated in FIG. 8. The two PMOS transistors P621 and P622 help the amplification operations of PMOS transistors P611 and P612.

Figure 16:
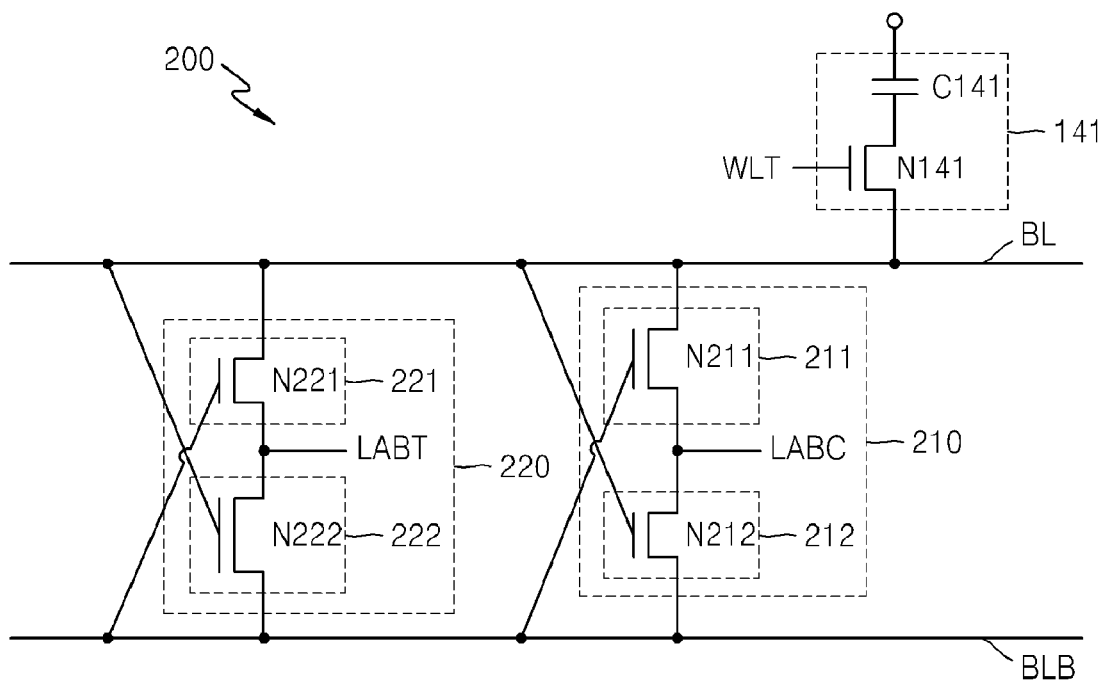
FIG. 16 is a circuit diagram further illustrating the sense amplifier block of FIG. 9 according to another embodiment of the inventive concept.

FIG. 16 is a circuit diagram further illustrating the interior sense amplifier block 200 of FIG. 9 according to another embodiment of the inventive concept. The sense amplifier block 200 of FIG. 16 includes both the first sense amplification unit 210 and the second sense amplification unit 220, while the sense amplifier block 200 of FIG. 9 only includes the first sense amplification unit 210. The second sense amplification unit 220 helps the amplification operation of the first sense amplification unit 210. The first memory cell 141 is connected to the sense amplifier block 200 of FIG. 16 while the second memory cell 142 is connected to the sense amplifier block 200 of FIG. 9.

Referring to FIG. 16, the first sense amplifier 211, the second sense amplifier 212, the third sense amplifier 221 and the fourth sense amplifier 222 can respectively include the first NMOS transistor N211, the second NMOS transistor N212, a third NMOS transistor N221 and a fourth NMOS transistor N222. The first NMOS transistor N211 has a size larger than that of the second NMOS transistor N212 and the fourth NMOS transistor N222 has a size larger than that of the third NMOS transistor N221.

Figure 17:
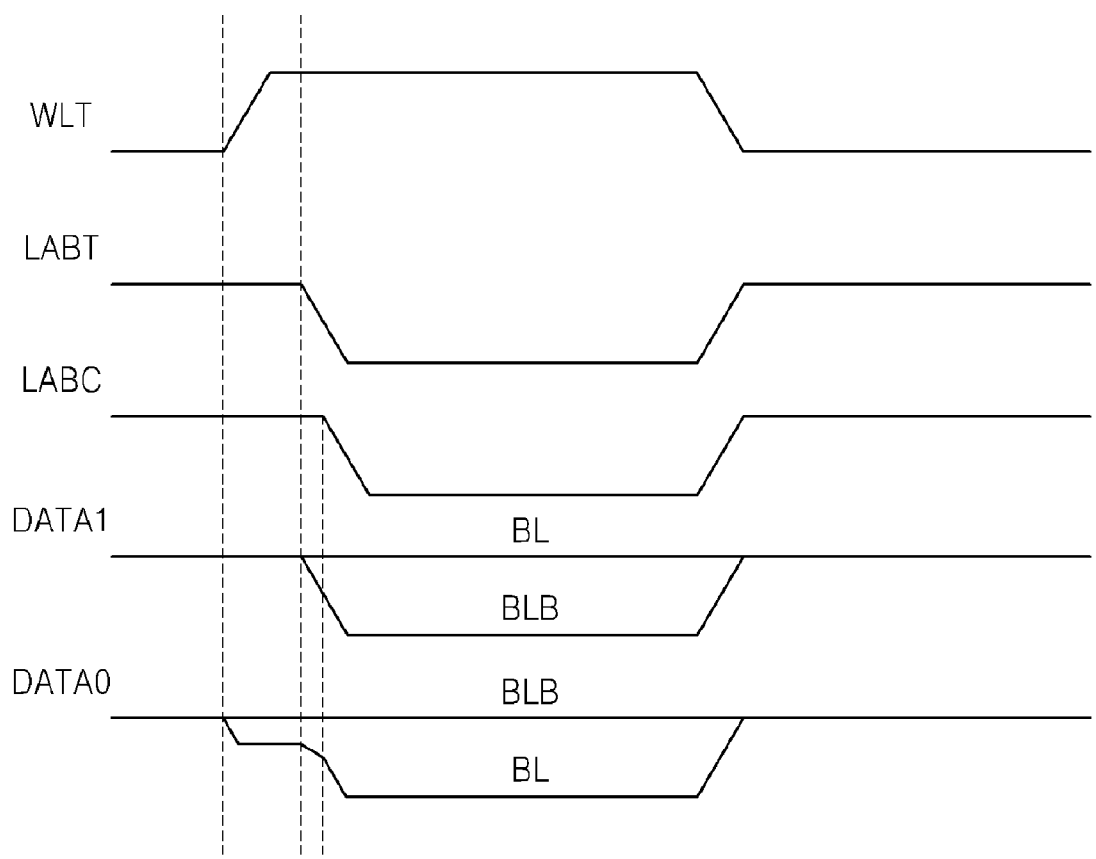
FIG. 17 is a timing diagram illustrating an operation of selecting the first memory cell of FIG. 16.

FIG. 17 is a timing diagram illustrating an operation of selecting the first memory cell 141 of FIG. 16. In the working example, it is assumed that the bit line BL and the complementary bit line BLB are precharged to the power supply voltage.

If the data stored in the first memory cell 141 has a value of '0', that is, if the first capacitor C141 is not charged, charge-sharing occurs between the bit line BL and the first capacitor C141. Accordingly, the voltage of the bit line BL falls below the voltage on the complementary bit line BLB, and the voltage applied to a gate of the third NMOS transistor N221 is higher than the voltage applied to a gate of the fourth NMOS transistor N222. When a third control signal LABT goes low and a fourth control signal LABC is maintained high, the third NMOS transistor N221 receives current from the bit line BL to decrease the voltage on the bit line BL, since the voltage applied to the gate of the third NMOS transistor N221 is higher than the voltage applied to the gate of the fourth NMOS transistor N222.

The role of the first sense amplification unit 210 in helping the amplification operation of the second sense amplification unit 220 will now be explained. The third NMOS transistor unit N221 cannot rapidly decrease the voltage of the bit line BL because the third NMOS transistor N221 has a size smaller than the fourth NMOS transistor N222. Accordingly, the voltage of the bit line BL is rapidly decreased using the first NMOS transistor N211 of the first sense amplification unit 210.

Referring to FIG. 17, the third control signal LABT goes low, and then the fourth control signal LABC goes low. Accordingly, the first NMOS transistor N211 and the second NMOS transistor N212 are able to pass current from the bit line BL and the complementary bit line BLB. At the moment in time when the fourth control signal LABC goes low, the voltage of the complementary bit line BLB is at a slightly decreased level according to the fourth NMOS transistor N222, and thus, the voltage applied to the gate of the first NMOS transistor N211 is higher than the voltage applied to the gate of the second NMOS transistor N212. Accordingly, the first NMOS transistor N211 receives current from the bit line BL to decrease the voltage on the bit line BL. The voltage of the bit line BL can be rapidly reduced because the first NMOS transistor N211 has a large size.

If the data stored in the first memory cell 141 has a value of '1', that is, if the first capacitor C141 is charged, the voltage of the bit line BL is maintained equal to the voltage of the complementary bit line BLB. That is, the bit line BL maintains a precharged logic high state. In this case, the voltage applied to the gate of the third NMOS transistor N221 equals the voltage applied to the gate of the fourth NMOS transistor N222. When the third control signal LABT goes low and the fourth control signal LABC is maintained high, the driving capability of the fourth NMOS transistor N222 becomes greater than that of the third NMOS transistor N221 because the fourth NMOS transistor N222 has a size larger than that of the third NMOS transistor N221. Accordingly, the fourth NMOS transistor N222 receives current from the complementary bit line BLB to decrease the voltage on the complementary bit line BLB.

Here, the voltage of the bit line BL can be rapidly increased using only the fourth NMOS transistor N222 because the fourth NMOS transistor N222 has a size larger than that of the third NMOS transistor N221.

From the foregoing, those skilled in the art will be able to understand an example wherein the data stored in the first memory cell 141 has a value of '0'. Accordingly, this particular case will not be recited in detail.

In the foregoing embodiments, the terms "small" and "large" have been used to describe transistors of relative current carrying capacity. Those of ordinary skill in the art will understand from the foregoing the specific choice of components will vary by design, but the relative capacity of said small and large transistor will remain despite variations in specific designs. Hence, as understood by those skilled in the art "small" means less than large and "large" means more than small.

Those skilled in the art also understand the phrase "a sense amplifier supplies/receives current to/from." Sense amplifiers are well known circuits performing well understood functions of supplying current to a related circuit or receiving current from said related circuit.

While the inventive concept has been particularly shown and described with reference to exemplary embodiments thereof, it will be understood that various changes in form and details may be made therein without departing from the scope of the following claims.

What is claimed is:

1. A semiconductor device comprising:
an alternating arrangement of memory cell blocks and sense amplifier blocks, such that the sense amplifier blocks include an interior sense amplifier block and an periphery amplifier block;
wherein the peripheral amplifier block comprises a first sense amplification unit comprising a first sense amplifier and a second sense amplifier cross-coupled between a bit line and a complementary bit line,
the first sense amplifier supplies/receives current to/from the bit line, the second sense amplifier provides/receives current to/from the complementary bit line, and
a current driving capability for the first sense amplifier is greater than a current driving capability of the second sense amplifier.

2. The semiconductor device of claim 1, wherein a memory cell connected to the periphery sense amplifier block is coupled to the complementary bit line.

3. The semiconductor device of claim 2, further comprising:
a data restoration unit configured to restore a data value to the memory cell.

4. The semiconductor device of claim 1, wherein the first sense amplifier and the second sense amplifier have different driving capabilities that depend on load differences between the bit line and the complementary bit line.

5. The semiconductor device of claim 1, wherein the interior sense amplifier block comprises a third sense amplification unit comprising a fifth sense amplifier and a sixth sense amplifier cross-coupled between the bit line and the complementary bit line,
the fifth sense amplifier supplies/receives current to/from the bit line,
the sixth sense amplifier provides/receives current to/from the complementary bit line, and
a driving capability for the fifth sense amplifier is equal to a driving capability for the sixth sense amplifier.

6. The semiconductor device of claim 1, wherein
the first sense amplifier comprises a first MOS transistor having a gate connected to the complementary bit line and a first terminal connected to the bit line,
the second sense amplifier comprises a second MOS transistor having a gate connected to the bit line and a first terminal connected to the complementary bit line, and
the first MOS transistor has a size larger than that of the second MOS transistor.

7. The semiconductor device of claim 6, wherein the first MOS transistor and the second MOS transistor vary in size in relation to a difference between respective loads on the bit line and the complementary bit line.

8. The semiconductor device of claim 7, wherein the first MOS transistor and the second MOS transistor vary in size in relation to respective numbers of memory cells connected to the bit line and the complementary bit line.

9. The semiconductor device of claim 1, wherein
the third sense amplifier comprises a third MOS transistor having a gate connected to the complementary bit line and a first terminal connected to the bit line,
the fourth sense amplifier comprises a fourth MOS transistor having a gate connected to the bit line and a first terminal connected to the complementary bit line, and
the fourth MOS transistor has a size greater than that of the third MOS transistor.

10. The semiconductor device of claim 1, wherein the first sense amplification unit supplies current to the bit line and the complementary bit line when the bit line and the complementary bit line are precharged to ground voltage.

11. The semiconductor device of claim 1, wherein the first sense amplification unit receives current from the bit line and the complementary bit line when the bit line and the complementary bit line are precharged to a power supply voltage.

12. The semiconductor device of claim 1, further comprising:
a precharge unit configured to precharge the bit line and the complementary bit line to either a power supply voltage or ground voltage.

13. The semiconductor device of claim 1, wherein the periphery sense amplifier block comprises a second sense amplification unit comprising a third sense amplifier and a fourth sense amplifier cross-coupled between the bit line and the complementary bit line, and a current driving capability for the fourth sense amplifier that provides/receives current to/from the complementary bit line is greater than a current driving capability for the third sense amplifier that provides/receives current to/from the bit line.

14. A semiconductor device comprising:
an alternating arrangement of memory cell blocks and sense amplifier blocks, such that the sense amplifier blocks include an interior sense amplifier block and an periphery amplifier block;
wherein the periphery sense amplifier block comprises a second sense amplification unit comprising a third sense amplifier and a fourth sense amplifier cross-coupled between a bit line and a complementary bit line,
the third sense amplifier supplies/receives current to/from the bit line, the fourth sense amplifier provides/receives current to/from the complementary bit line, and
a current driving capability for the fourth sense amplifier is greater than a current driving capability for the third sense amplifier.

15. The semiconductor device of claim 14, wherein a memory cell connected to the periphery sense amplifier block is coupled to the bit line.

16. The semiconductor device of claim 14, wherein the interior sense amplifier block comprises a third sense amplification unit comprising a fifth sense amplifier and a sixth sense amplifier cross-coupled between the bit line and the complementary bit line,
the fifth sense amplifier supplies/receives current to/from the bit line,
the sixth sense amplifier provides/receives current to/from the complementary bit line, and
a driving capability for the fifth sense amplifier is equal to a driving capability for the sixth sense amplifier.

* * * * *